(12) United States Patent
Schmidt

(10) Patent No.: US 11,327,057 B2
(45) Date of Patent: May 10, 2022

(54) GAS CHROMATOGRAPH (GC) DETECTOR TO PROVIDE GC MEASUREMENT IN DIGITAL FORM

(71) Applicant: Siemens Aktiengesellschaft, Munich (DE)

(72) Inventor: Glen Eugene Schmidt, Bartlesville, OK (US)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 523 days.

(21) Appl. No.: 16/343,832

(22) PCT Filed: Oct. 28, 2016

(86) PCT No.: PCT/US2016/059244
§ 371 (c)(1),
(2) Date: Apr. 22, 2019

(87) PCT Pub. No.: WO2018/080511
PCT Pub. Date: May 3, 2018

(65) Prior Publication Data
US 2019/0242859 A1 Aug. 8, 2019

(51) Int. Cl.
*G01N 30/66* (2006.01)
*G01N 30/62* (2006.01)
(Continued)

(52) U.S. Cl.
CPC ....... *G01N 30/66* (2013.01); *G01N 2030/025* (2013.01); *G01N 2030/626* (2013.01);
(Continued)

(58) Field of Classification Search
None
See application file for complete search history.

(56) References Cited

U.S. PATENT DOCUMENTS 4,063,447 A 12/1977 Mathison
2012/0010825 A1 1/2012 Hadley et al.

FOREIGN PATENT DOCUMENTS

CN 1531197 A 9/2004
CN 1965465 A 5/2007
(Continued)

OTHER PUBLICATIONS

Rastrello F et al: "Thermal Conductivity Detector for gas-chromatography: Acquisition system and experimental measurements", 2013 IEEE International Instrumentation and Measurement Technology Conference (I2MTC), IEEE, pp. 1226-1230, XP032197030, ISSN: 1091-5281, ISBN: 978-1-4673-4621-4, DOI:10.1109/I2MTC.2012.6229304, the whole document / May 13, 2012.
(Continued)

*Primary Examiner* — Daniel S Larkin

(57) ABSTRACT

A Gas Chromatograph (GC) detector comprises a first circuit, a second circuit, a digital subtractor and a digital logic shared between one to many detector channels to provide a GC measurement in a digital form. The first circuit includes a first counter circuitry to provide a first counter output. The second circuit includes a second counter circuitry to provide a second counter output. The GC detector includes a digital subtractor to subtract the first counter output from the second counter output and provide a digital subtractor output. The GC detector further includes a digital logic shared between one to many detector channels to implement at least a portion of the first counter circuitry and the second counter circuitry. The digital logic to receive the digital subtractor output and provides the GC measurement in the digital form. The GC detector may be based on a Thermal Conductivity Detector (TCD) in which an integrator of a Sigma-Delta ($\Sigma$-$\Delta$) A/D converter is eliminated and the $\Sigma$ factor of the Sigma-Delta ($\Sigma$-$\Delta$) A/D converter is accomplished in a digital form.

17 Claims, 4 Drawing Sheets

(51) Int. Cl.
*H03M 3/00* (2006.01)
*G01R 17/10* (2006.01)
*G01N 30/02* (2006.01)

(52) U.S. Cl.
CPC ............ *G01R 17/10* (2013.01); *H03M 3/30* (2013.01); *H03M 3/464* (2013.01)

(56) References Cited

FOREIGN PATENT DOCUMENTS

| | | | |
|---|---|---|---|
| CN | 1977458 | A | 6/2007 |
| CN | 101262226 | A | 3/2008 |
| CN | 101300486 | A | 11/2008 |
| CN | 101662262 | A | 3/2010 |
| CN | 102297730 | A | 12/2011 |
| CN | 102394634 | A | 3/2012 |
| CN | 102545815 | A | 7/2012 |
| CN | 104660930 | A | 5/2015 |
| CN | 104977377 | A | 10/2015 |
| CN | 105634495 | A | 6/2016 |

OTHER PUBLICATIONS

Liu Hongfei et al: "Signal Conditioning Circuit Design for Micro Gas Chromatograph", Computer Science-Technology and Applications, 2009. IFCSTA 109. International Forum On, IEEE, Piscataway, NJ, USA, Dec. 25, 2009 (Dec. 25, 2009), pp. 86-89, XP031613630.
PCT International Search Report and Written Opinion of International Searching Authority dated Jul. 24, 2017 corresponding to PCT International Application No. PCT/SU2016/059244 filed Oct. 28, 2016.

US 11,327,057 B2

GAS CHROMATOGRAPH (GC) DETECTOR TO PROVIDE GC MEASUREMENT IN DIGITAL FORM

BACKGROUND

1. Field

Aspects of the present invention generally relate to a Gas Chromatograph (GC) measurement system and more specifically relates to a GC detector based on a Thermal Conductivity Detector (TCD) in which an integrator of a Sigma-Delta ($\Sigma$-$\Delta$) A/D converter is eliminated and the $\Sigma$ factor of the Sigma-Delta ($\Sigma$-$\Delta$) A/D converter is accomplished in a digital form for one to many detector channels by implementing a digital logic.

2. Description of the Related Art

A common implementation of a Gas Chromatograph (GC) Thermal Conductivity Detector (TCD) constant temperature circuit is shown in FIG. 1. A high performing, state of the art GC system has several critical components, with the primary objective to be a very low noise, low drift measurement that extends into a few micro volts of peak to peak noise and signal while within a large dynamic range of 10-20 volts, thus having an overall Signal to Noise Ratio (SNR) of 134 dB or greater, in practical implementations of a 24 bit system. Since a GC measurement system does cycle to cycle calibrations, the absolute accuracy is of less importance than the repeatability of the system. Thus drift and stability of the baseline as well as peak to peak noise tend to drive the performance criteria from an electrical perspective.

It is well known to those skilled in the art, that an analog-to-digital (A/D) converter is the cornerstone of this performance, and may well be the most important electronic component in a GC measurement system, aside from a detector element itself.

The pace of technological development of electrical measurement in the GC industry is closely matched with the pace of the Sigma-Delta ($\Sigma$-$\Delta$) A/D converters. With a total world market of a few thousand units per year, the GC industry is trivial in comparison to the overall commercial market for monolithic A/D converter IC's. Thus, while monolithic $\Sigma$-$\Delta$ A/D converters are now entering their 6th generation in the course of 20 years, no A/D manufacturer has a focus directly on the GC application as they add some "one size fits all" features that potentially work against the GC application. In fact, with the constant market pressure on low power cellular devices and audio codecs, the major players in the monolithic $\Sigma$-$\Delta$ A/D industry are moving to lower voltage devices that also focus on very high speed acquisition for consumer devices, and not for process measurement instruments. Unfortunately, this is entirely opposite of the direction that is needed to advance the technology of GC A/D conversion. Physical properties lie in the way of reducing GC circuitry power to match the low power of the plethora of commercial devices available.

A Thermal Conductivity Detector (TCD) requires a certain amount of power to operate properly in a GC application. The thermal conductivity of the common GC carrier gasses hydrogen and helium is fixed. The TCD operating voltage/power (as related to a thermal conductivity measurement) cannot be lowered without a complete change in measurement technology. To make the voltage of the detector compatible with a new, lower voltage A/D, the signal voltage must be reduced in gain before going to the A/D. Clearly, to those skilled in the art, reducing the signal is counter-intuitive to good design, as a reduction in gain is a reduction in SNR, as the GC measurement noise floor is "flat" with respect to the degained signal.

Likewise, in the spectral domain, GC TCD signals are very low frequency, with the primary content being <10 HZ and typically <0.01 Hz when including baseline stability. Having an A/D converter that is targeted to perform well as a consumer device at audio frequencies means that the noise power in the sub hertz region is not optimized and is therefore a nuisance to the GC application, and cannot be filtered out, since the signal bandwidth and noise bandwidth are the same. At the present, there are no 24 bit monolithic devices that accept greater than 5V signal and operate close to 24 ENOB's (Effective Number of Bits) in the sub 10 Hz GC benchmark sampling range. Finally, the A/D converter is normally a very expensive part, yet it is essential for producing a GC measurement system.

The problem is currently addressed with monolithic Sigma-Delta ($\Sigma$-$\Delta$) A/D converters which are fixed building blocks, not entirely suited to GC designs. The industry players for such a device are Analog Devices, Texas Instruments and Linear Technology. A current GC measurement system uses the Analog Devices AD7190 device. It is currently state of the art for GC applications. While it performs well, further improvements are needed.

Therefore, there is a need for an improved A/D conversion for process measurement instruments such as a Gas Chromatograph (GC) measurement system.

SUMMARY

Briefly described, aspects of the present invention relate to a process measurement instrument such as a Gas Chromatograph (GC) measurement system that provides a GC measurement in a digital form. In particular, embodiments of the present invention relate to a GC detector including a Thermal Conductivity Detector (TCD) in which an integrator of a Sigma-Delta ($\Sigma$-$\Delta$) A/D converter is eliminated and the/factor of the Sigma-Delta ($\Sigma$-$\Delta$) A/D converter is accomplished in a digital form by implementing a digital logic for counter circuitry shared between one to many detector channels. One of ordinary skill in the art appreciates that such a Gas Chromatograph (GC) measurement system can be configured to be installed in different environments where such measurement is needed, for example, in a digital form using a Field Programmable Gate Array (FPGA), a processor, a monolithic gate array, or a collection of logic.

In accordance with one illustrative embodiment of the present invention, a Gas Chromatograph (GC) detector is provided. The GC detector comprises a first circuit including a first counter circuitry having a first N-bit counter to receive a first count up signal and a first count down signal in response to a first amplifier output and provide a first counter output. The GC detector further comprises a second circuit including a second counter circuitry having a second N-bit counter to receive a second count up signal and a second count down signal in response to a second amplifier output and provide a second counter output. The GC detector further comprises a digital subtractor to subtract the first counter output from the second counter output and provide a digital subtractor output. The GC detector further comprises a digital logic shared between one to many detector channels to implement at least a portion of the first counter circuitry and the second counter circuitry. The digital logic to receive the digital subtractor output and provide a GC measurement in a digital form.

In accordance with another illustrative embodiment of the present invention, a Gas Chromatograph (GC) detector is provided. The GC detector comprises a first circuit portion, a second circuit portion, a digital subtractor of an A/D converter to subtract the first counter output from the second counter output and provide a digital subtractor output and a Field Programmable Gate Array (FPGA) shared between one to many detector channels. The FPGA to receive the digital subtractor output and provide a GC measurement in a digital form. The first circuit portion includes a constant temperature Thermal Conductivity Detector (TCD) reference amplifier including a first Thermal Conductivity Detector (TCD) and a first bridge. The constant temperature Thermal Conductivity Detector (TCD) reference amplifier to provide a first amplifier output. The first circuit portion further includes a first comparator logic to receive the first amplifier output and provide a first count up signal and a first count down signal, a first N-bit counter to receive the first count up signal and the first count down signal and provide a first counter output, and a first N-bit Pulse Width Modulator (PWM) to provide a first PWM output. The second circuit portion includes a constant temperature Thermal Conductivity Detector (TCD) amplifier including a second Thermal Conductivity Detector (TCD) and a second bridge. The constant temperature Thermal Conductivity Detector (TCD) amplifier to provide a second amplifier output. The second circuit portion further includes a second comparator logic to receive the second amplifier output and provide a second count up signal and a second count down signal, a second N-bit counter to receive the second count up signal and the second count down signal and provide a second counter output, and a second N-bit Pulse Width Modulator (PWM) to provide a second PWM output.

In accordance with yet another illustrative embodiment of the present invention, a Gas Chromatograph (GC) detector is provided. The GC detector comprises a first amplifier including a Thermal Conductivity Detector (TCD) and a resistive bridge. The first amplifier to provide a first amplifier output. The GC detector further comprises a monolithic sigma-delta modulator including a latched comparator as a 1-bit Analog to Digital Coveter (ADC) to receive the first amplifier output and a clock input to provide a first output signal, a digital filter and decimator to receive the first output signal and a sample frequency input to provide digital results, and a 1-bit Digital to Analog Converter (DAC) to receive a 1-bit data stream from the latched comparator to provide a 1-bit DAC output. The GC detector further comprises a second amplifier to receive the 1-bit DAC output and provide a second amplifier input to the resistive bridge.

DETAILED DESCRIPTION

To facilitate an understanding of embodiments, principles, and features of the present invention, they are explained hereinafter with reference to implementation in illustrative embodiments. In particular, they are described in the context of a Gas Chromatograph (GC) Thermal Conductivity Detector (TCD) constant temperature detector circuit. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
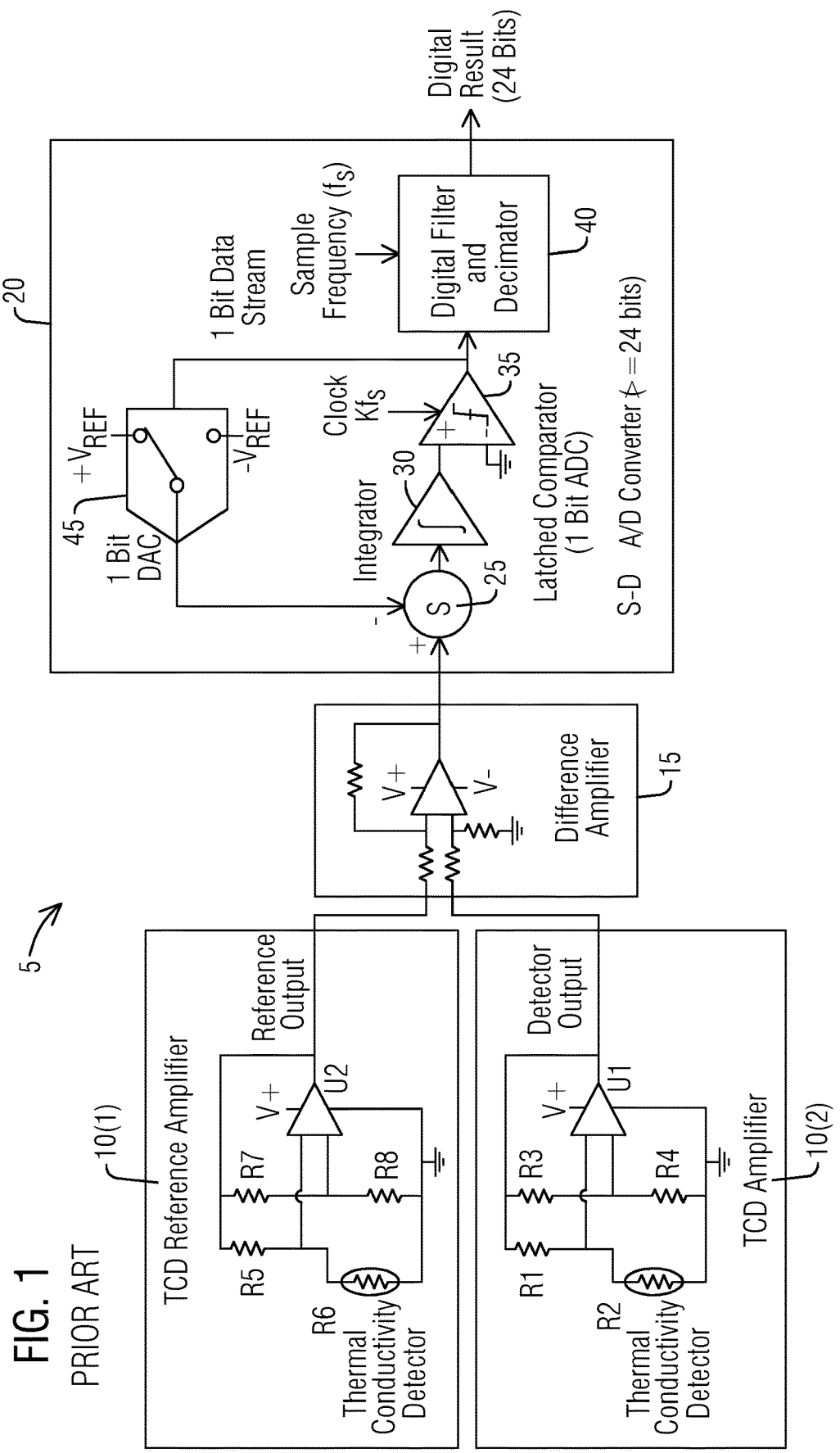
FIG. 1 illustrates a prior art Gas Chromatograph (GC) Thermal Conductivity Detector (TCD) constant temperature circuit.

FIG. 1 illustrates a prior art Gas Chromatograph (GC) Thermal Conductivity Detector (TCD) constant temperature circuit 5. The circuit 5 includes a constant temperature TCD reference amplifier 10(1) and a constant temperature TCD amplifier 10(2). The constant temperature TCD reference amplifier 10(1) includes a Thermal Conductivity Detector (TCD), an amplifier U2 and resistors R5, R6, R7, and R8. The constant temperature TCD reference amplifier 10(1) provides a reference output. The constant temperature TCD amplifier 10(2) includes a Thermal Conductivity Detector (TCD), an amplifier U1 and resistors R1, R2, R3, and R4. The constant temperature TCD amplifier 10(2) provides a detector output. The circuit 5 further includes a difference amplifier 15 and receives the reference output and the detector output. The circuit 5 further includes a Sigma-Delta ($\Sigma$-$\Delta$) A/D converter (>=24 bits) 20 coupled to the difference amplifier 15 to provide a digital result such as having 24 bits.

The Sigma-Delta ($\Sigma$-$\Delta$) A/D converter 20 includes a summer 25 coupled to an integrator ∫ 30 which in turn is coupled to a latched comparator 35. The latched comparator 35 provides input to a digital filter and decimator 40. The digital filter and decimator 40 receives an input of a sample frequency ($f_s$). The latched comparator 35 provides input of a 1-Bit data stream to a 1-Bit digital-to-analog converter (DAC) 45. The 1-Bit digital-to-analog converter (DAC) 45 provides an input to the summer 25.

The primary objective of the prior art Gas Chromatograph (GC) Thermal Conductivity Detector (TCD) constant temperature circuit 5 is to enable a very low noise, low drift measurement that extends into a few micro volts of peak to peak noise and signal while within a large dynamic range of 10-20 volts, thus having an overall Signal to Noise Ratio (SNR) of 134 dB or greater, in practical implementations of a 24 bit system. For such a GC measurement system drift and stability of the baseline as well as peak to peak noise tend to drive the performance criteria from an electrical perspective.

An analog-to-digital (A/D) converter is the cornerstone of the above performance, and may well be the most important electronic component in a GC measurement system, aside from a detector element itself. However, the most current Sigma-Delta ($\Sigma$-$\Delta$) A/D converters or the monolithic A/D converter ICs potentially work against a GC application. For example, the monolithic $\Sigma$-$\Delta$ A/D industry is moving to lower voltage devices that also focus on very high speed acquisition for consumer devices, and not on developing technology of GC A/D conversion in process measurement instruments. Unfortunately, physical properties lie in the way of reducing GC circuitry power to match the low power of the plethora of commercial devices available.

Figure 2:
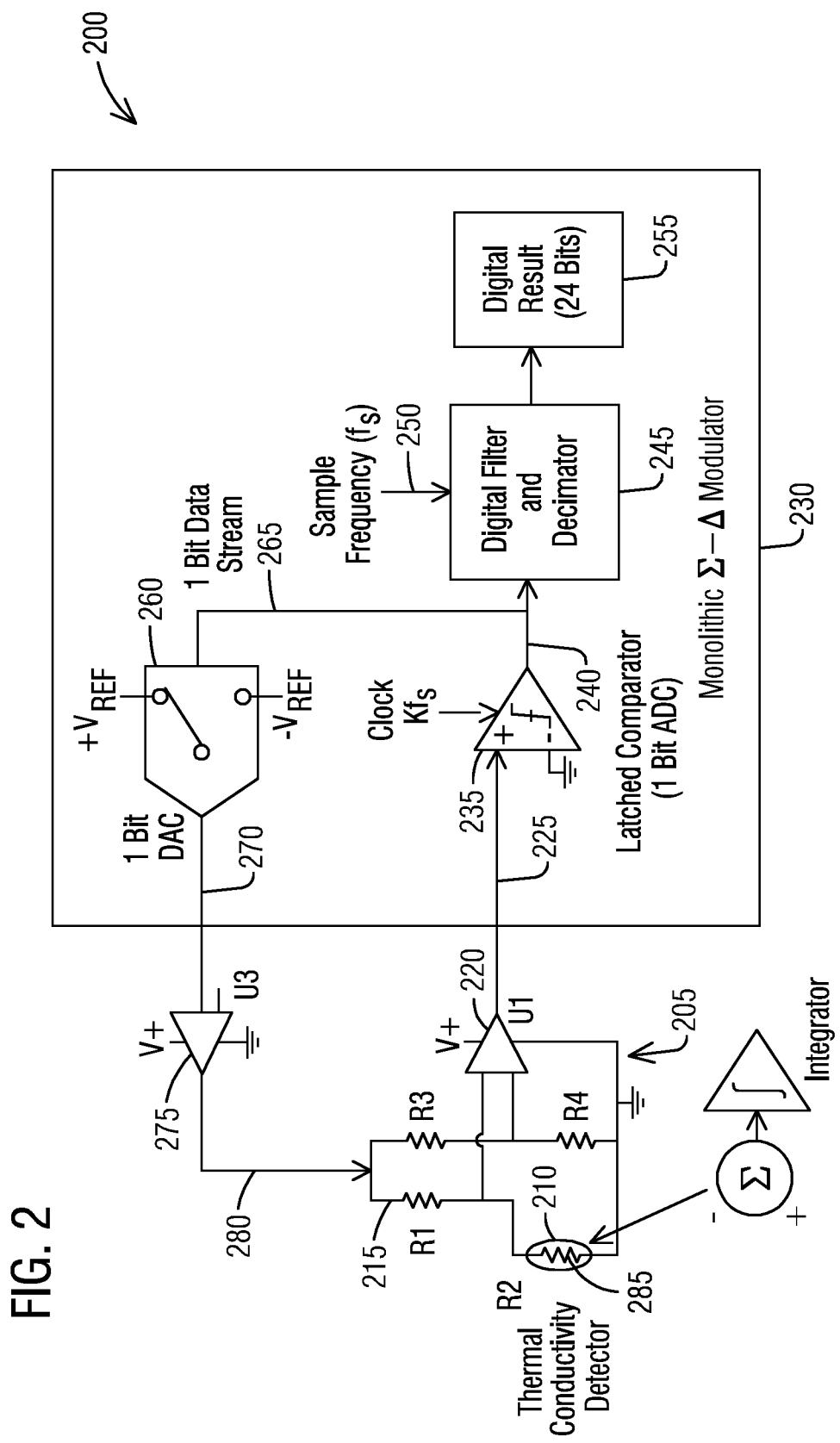
FIG. 2 illustrates a Gas Chromatograph (GC) detector in accordance with one illustrative embodiment of the present invention.

Referring to FIG. 2, it illustrates a Gas Chromatograph (GC) detector 200 in accordance with one illustrative embodiment of the present invention. The Gas Chromatograph (GC) detector 200 comprises a first amplifier 205 including a Thermal Conductivity Detector (TCD) 210 and a resistive bridge 215. The resistive bridge 215 includes a plurality of resistors R1-R4. The first amplifier 205 includes an operational amplifier U1 220 (often called op-amp or opamp) which is a DC-coupled high-gain electronic voltage amplifier with a differential input and a single-ended output.

The first amplifier 205 is configured to provide a first amplifier output 225 to a monolithic Sigma-Delta (Σ-Δ) modulator 230. The monolithic Sigma-Delta (Σ-Δ) modulator 230 includes a latched comparator 235 as a 1-bit Analog to Digital Coveter (ADC) to receive the first amplifier output 225 and a clock input ($Kf_s$) to provide a first output signal 240. The monolithic Sigma-Delta (Σ-Δ) modulator 230 further includes a digital filter and decimator 245 to receive the first output signal 240 and a sample frequency input ($f_s$) 250 to provide digital results 255 of a GC measurement. The monolithic Sigma-Delta (Σ-Δ) modulator 230 further includes a 1-bit Digital to Analog Converter (DAC) 260 to receive a 1-bit data stream 265 from the latched comparator 235 to provide a 1-bit DAC output 270. The Gas Chromatograph (GC) detector 200 comprises a second amplifier 275 to receive the 1-bit DAC output 270 and provide a second amplifier input 280 to the resistive bridge 215.

The Gas Chromatograph (GC) detector 200 merges the functionality of a Sigma-Delta (Σ-Δ) analog-to-digital (A/D) converter into the inherent characteristics of a constant temperature TCD amplifier such as the Thermal Conductivity Detector (TCD) 210. The Thermal Conductivity Detector (TCD) 210 is an implementation for a constant temperature TCD. The first amplifier 205 works to balance the ratios R1/R2 to equal R3/R4 by adjusting the power in a TCD element R2 285 by adjusting a voltage across the resistive bridge 215. R2 is an element with a temperature variant resistance (either PTC or NTC). As power is added or removed, the resistance changes until an equilibrium is met between an applied power and the resistance. Note that a certain resistance=a certain temperature, hence the TCD element R2 285 is in "constant temperature" mode.

Measurement gas and carrier gas presented across the TCD element R2 285 cause small changes in thermal conductivity which, in turn, create small changes in the power, which causes the operational amplifier U1 220 to react to maintain the equilibrium. A second circuit (not shown) comprised of an operational amplifier U2 et al. has a reference gas only, and works in an identical manner. A subsequent difference amplifier circuit (not shown) removes the large common mode range and provides a highly resolved difference signal to an A/D, and thus the resulting chromatograph signal or "chrom."

Note that there is a natural time constant associated with the thermal properties of the TCD element R2 285, and this may or may not be compensated for by additional elements (not shown) in the Gas Chromatograph (GC) detector 200. This time constant is important, as the Gas Chromatograph (GC) detector 200 in FIG. 2, eliminates the integrator ∫ 30 shown in FIG. 1. In other words, an A/D converter is reduced in complexity by taking advantage of an inherent property of the TCD element R2 285 to be an integrating element and compensating circuitry. By eliminating the integrator 30 in the monolithic Sigma-Delta (Σ-Δ) modulator 230, a difficult aspect of the absolute accuracy of the A/D is eliminated, but the absolute accuracy is not something that is important to a GC application. Absolute accuracy is important to other (non-GC) consumers of Σ-Δ converters, thus constituting a majority of applications, and thus a defining feature for what is commercially available.

Note that for simplicity, the difference amplifier 15 of FIG. 1 is not shown. This is because, in theory, the subtraction could be done digitally. However, in reality, this is not a good practice. This is because without analog subtraction prior to the A/D, nearly 100% of the 24 bit range is consumed by dynamic range, thus leaving only a few A/D counts for the actual A/D signal. Such a practice would only be meaningful if there were more significant bits (LSB counts) of usable resolution. This problem can be solved by taking a Gas Chromatograph (GC) detector, as shown in FIG. 3.

Figure 3:
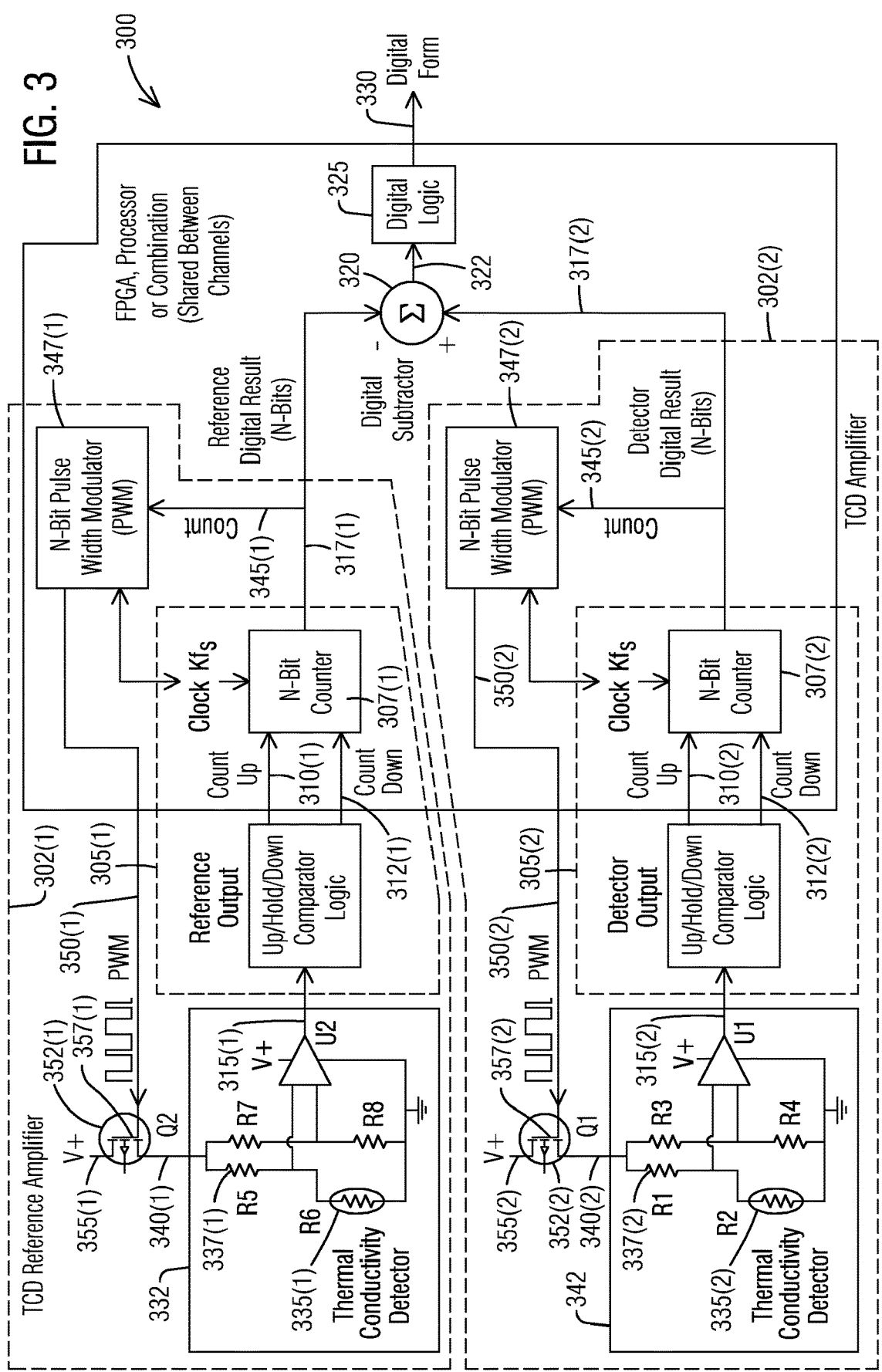
FIG. 3 illustrates a Gas Chromatograph (GC) detector in accordance with another illustrative embodiment of the present invention.

Turning now to FIG. 3, it illustrates a Gas Chromatograph (GC) detector 300 in accordance with another illustrative embodiment of the present invention. The Gas Chromatograph (GC) detector 300 comprises a first circuit 302(1) including a first counter circuitry 305(1) having a first N-bit counter 307(1) to receive a first count up signal 310(1) and a first count down signal 312(1) in response to a first amplifier output 315(1) and provide a first counter output 317(1). The first N-bit counter 307(1) may be a device which stores the number of times a particular event or process has occurred, in relationship to a clock signal. For example, the first N-bit counter 307(1) may be a sequential digital logic circuit with an input line called the "clock" and multiple output lines. The values on the output lines represent a number in the binary or BCD number system. Each pulse applied to the clock input increments or decrements the number in the first N-bit counter 307(1). The first N-bit counter 307(1) may be constructed of a number of flip-flops connected in cascade.

The Gas Chromatograph (GC) detector 300 further comprises a second circuit 302(2) including a second counter circuitry 305(2) having a second N-bit counter 307(2) to receive a second count up signal 310(2) and a second count down signal 312(2) in response to a second amplifier output 315(2) and provide a second counter output 317(2). The second N-bit counter 307(2) may be a device which stores the number of times a particular event or process has occurred, in relationship to a clock signal. For example, the second N-bit counter 307(2) may be a sequential digital logic circuit with an input line called the "clock" and multiple output lines. The values on the output lines represent a number in the binary or BCD number system. Each pulse applied to the clock input increments or decrements the number in the second N-bit counter 307(2). The second N-bit counter 307(2) may be constructed of a number of flip-flops connected in cascade.

The Gas Chromatograph (GC) detector 300 further comprises a digital subtractor 320 to subtract the first counter output 317(1) from the second counter output 317 (2) and provide a digital subtractor output 322. The digital subtractor 320 may use the binary subtraction process. In the general case of calculations on multi-bit numbers, three bits are involved in performing the subtraction for each bit of the difference: the minuend, subtrahend, and a borrow in from the previous (less significant) bit order position. The outputs are the difference bit and borrow bit. The digital subtractor 320 may be implemented within a binary adder when using the standard two's complement notation, by providing an addition/subtraction selector to the carry-in and to invert the second operand.

The Gas Chromatograph (GC) detector 300 further comprises a digital logic 325 shared between one to many detector channels to implement at least a portion of the first counter circuitry 305(1) and the second counter circuitry 305(2). The digital logic 325 is configured to receive the digital subtractor output 322 and provide a GC measurement in a digital form 330. The digital logic 325 is configured to operate on some combination of three basic logic functions: AND, OR, and NOT. The digital logic 325 may be simplified to a minimum set of necessary gates, given a number of inputs and a desired output map. Examples of the digital logic 325 include a Field Programmable Gate Array (FPGA), a processor, a monolithic gate array, and/or a collection of logic.

The first circuit 302(1) further comprises a reference amplifier 332 including a first Thermal Conductivity Detector (TCD) 335(1) to provide the first amplifier output 315(1). The reference amplifier 332 further comprises a first resistive bridge 337(1). The first N-bit counter 307(1) controls a first pulse width modulated signal 340(1) back to the first resistive bridge 337(1). The reference amplifier 332 reacts with a positive or negative assertion to indicate the first N-bit counter 307(1) to count up or down and when the first resistive bridge 337(1) is balanced. The first N-bit counter 307(1) is instructed neither to go up nor go down, and a first count 345(1) is a stable value proportional to a first bridge voltage.

The first circuit 302(1) further comprises a first digital pulse width modulator (PWM) 347(1). The first count 345(1) drives the first digital pulse width modulator (PWM) 347(1) by making a first PWM output 350(1) proportional to the first count 345(1). The first circuit 302(1) further comprises a first switch 352(1) coupled between an input voltage source 355(1) and the first resistive bridge 337(1) to receive the first PWM output 350(1) on a gate 357(1) of the first switch 352(1).

The second circuit 302(2) further comprises an amplifier 342 including a second Thermal Conductivity Detector (TCD) 335(2) to provide the second amplifier output 315(2). The amplifier 342 further comprises a second resistive bridge 337(2). The second N-bit counter 307(2) controls a second pulse width modulated signal 340(2) back to the second resistive bridge 337(2). The amplifier 342 reacts with a positive or negative assertion to indicate the second N-bit counter 307(2) to count up or down and when the second resistive bridge 337(2) is balanced. The second N-bit counter 307(2) is instructed neither to go up nor go down, and a second count 345(2) is a stable value proportional to a second bridge voltage.

The second circuit 302(2) further comprises a second digital pulse width modulator (PWM) 347(2). The second count 345(2) drives the second digital pulse width modulator (PWM) 347(2) by making a second PWM output 350(2) proportional to the second count 345(2). The second circuit 302(2) further comprises a second switch 352(2) coupled between an input voltage source 355(2) and the second resistive bridge 337(2) to receive the second PWM output 350(2) on a gate 357(2) of the second switch 352(2).

In the Gas Chromatograph (GC) detector 300, the first Thermal Conductivity Detector (TCD) 335(1) and the second Thermal Conductivity Detector (TCD) 335(2) are a higher voltage sensor such as a silicon MEMS TCD device. The GC detector 300 does not have an analog difference amplifier that removes a large common mode range and provides a highly resolved difference signal to a sigma-delta A/D converter and does not have an internal sigma block internal to the sigma-delta A/D converter like in FIG. 1.

Figure 4:
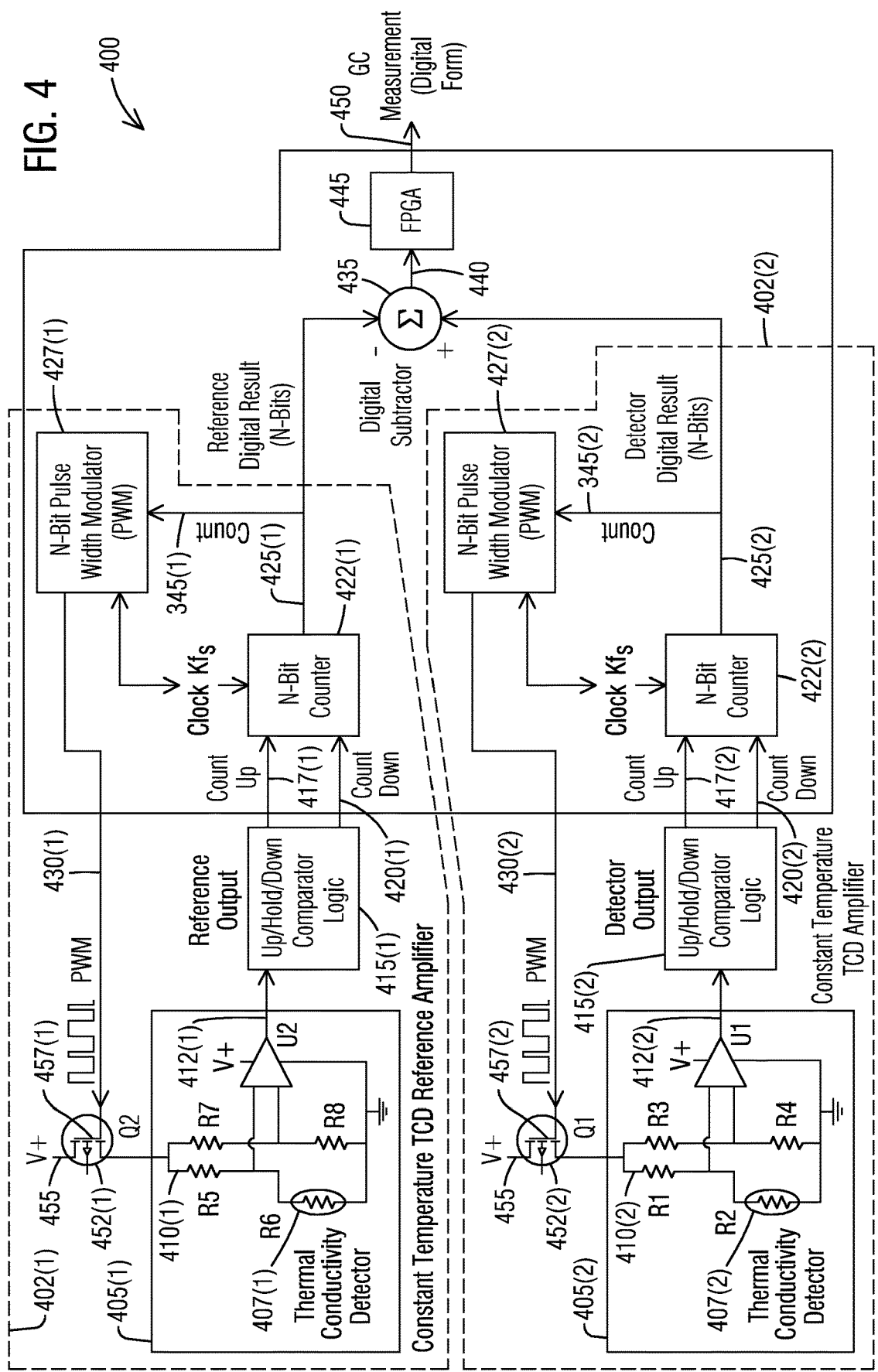
FIG. 4 illustrates a Gas Chromatograph (GC) detector in accordance with yet another illustrative embodiment of the present invention.

FIG. 4 illustrates a Gas Chromatograph (GC) detector 400 in accordance with yet another illustrative embodiment of the present invention. The Gas Chromatograph (GC) detector 400 comprises a first circuit portion 402(1) that includes a constant temperature Thermal Conductivity Detector (TCD) reference amplifier 405(1). The constant temperature Thermal Conductivity Detector (TCD) reference amplifier 405(1) includes a first Thermal Conductivity Detector (TCD) 407(1) and a first bridge 410(1). The constant temperature Thermal Conductivity Detector (TCD) reference amplifier 405(1) provides a first amplifier output 412(1). The first circuit portion 402(1) further includes a first comparator logic 415(1) to receive the first amplifier output 412(1) and provide a first count up signal 417(1) and a first count down signal 420(1). The first circuit portion 402(1) further includes a first N-bit counter 422(1) to receive the first count up signal 417(1) and the first count down signal 420(1) and provide a first counter output 425(1). The first circuit portion 402(1) further includes a first N-bit Pulse Width Modulator (PWM) 427(1) to provide a first PWM output 430(1).

The Gas Chromatograph (GC) detector 400 further comprises a second circuit portion 402(2) that includes a constant temperature Thermal Conductivity Detector (TCD) amplifier 405(2). The constant temperature Thermal Conductivity Detector (TCD) amplifier 405(2) includes a second Thermal Conductivity Detector (TCD) 407(2) and a second bridge 410(2). The constant temperature Thermal Conductivity Detector (TCD) amplifier 405(2) provides a second amplifier output 412(2). The second circuit portion 402(2) further includes a second comparator logic 415(2) to receive the second amplifier output 412(2) and provide a second count up signal 417(2) and a second count down signal 420(2). The second circuit portion 402(2) further includes a second N-bit counter 422(2) to receive the second count up signal 417(2) and the second count down signal 420(2) and provide a second counter output 425(2). The second circuit portion 402(2) further includes a second N-bit Pulse Width Modulator (PWM) 427(2) to provide a second PWM output 430(2).

The Gas Chromatograph (GC) detector 400 further comprises a digital subtractor 435 of an A/D converter to subtract the first counter output 425(1) from the second counter output 425(2) and provide a digital subtractor output 440. The Gas Chromatograph (GC) detector 400 further comprises a Field Programmable Gate Array (FPGA) 445 shared between one to many detector channels. The FPGA 445 to receive the digital subtractor output 440 and provide a GC measurement 450 in a digital form.

The first circuit portion 402(1) further comprises a first transistor 452(1) coupled between an input voltage source 455 and the first bridge 410(1) to receive the first PWM output 430(1) on a gate 457(1) of the first transistor 452(1). The second circuit portion 402(2) further comprises a second transistor 452(2) coupled between the input voltage source 455 and the second bridge 410(2) to receive the second PWM output 430(2) on a gate 457(2) of the second transistor 452(2). The first Thermal Conductivity Detector (TCD) 407(1) and the second Thermal Conductivity Detector (TCD) 407(2) are a silicon MEMS TCD device. The A/D converter is a sigma-delta A/D converter. The Gas Chromatograph (GC) detector 400 does not have an analog difference amplifier that removes a large common mode range and provides a highly resolved difference signal to the sigma-delta A/D converter and not have an internal sigma block internal to the sigma-delta A/D converter.

In FIG. 4, the first circuit portion 402(1) and second circuit portion 402(2) of the Gas Chromatograph (GC) detector 400 are the same, except one is the reference and the other is one (or more) detector circuits. In the constant temperature Thermal Conductivity Detector (TCD) amplifier 405(2) having an op-amp amplifier U1 circuit, the entire arrangement of R1, R2, R3, R4 and U1 are held in equilibrium of R1/R2=R3/R4 by a large, N bit counter, i.e., the second N-bit counter 422(2) which controls a pulse width modulated signal back to the second bridge 410(2). Assuming that N>>24, a very high resolution measurement may be attained. The op-amp amplifier U1 reacts with slight positive or negative assertions to indicate to the second N-bit counter 422(2) to count up or down. When the second bridge 410(2) is perfectly balanced, the second N-bit counter 422(2) is instructed neither to go up nor go down, and thus the count is the stable value proportional to the bridge voltage. The count is used to drive the second N-bit Pulse Width Modulator (PWM) 427(2) by making the PWM proportional to the count. The PWM and counter frequency fs>> (signal bandwidth) as well as the PWM rate is >> the time natural time constant of the TCD element, i.e., the second Thermal Conductivity Detector (TCD) 407(2).

The $\Sigma$ factor of the FIG. 1 is accomplished in a digital form, since there is really no issue in having a very high bit digital result. This entire implementation can efficiently be performed from just one to many detector channels, by implementing the digital portions in a Field Programmable Gate Array (FPGA). There are several points in the implementation of FIG. 4.

1. The amplifiers U1, U2 only need to react to a small amount to create the up/down count adjustments. Thus these may be ultra-low offset amplifiers or comparator devices as well. A large linear range is not required, as U1, U2 only need to provide feedback with respect to the balance of the bridge.
2. The input voltage range is not restricted in this implementation. It is really no problem for the comparator logic, being digital in nature, to adapt from the small error polarity to the UP/DOWN logic required for the counter. This is quite a significant advancement for a GC measurement, since the very best of the state of the art monolithic A/D converters have a 5V input range limit. Likewise, the transistors Q1, Q2 have no practical voltage limit in the context of a GC application. Thus the control loop can maintain control of a rather large bridge voltage, which is very important for high resistance TCD devices that have minimum amount of power required. For example, a Silicon MEMS TCD device with 10K$\Omega$ operating resistance in constant temperature operation may need as much as 60V to operate the bridge while delivering 90 mW of power to an element with hydrogen carrier passing over it. This is a problem for the monolithic implementation circuit in FIG. 1, but no issue for the Gas Chromatograph (GC) detector 400 presented herein. The traditional implementation such as FIG. 1 would require (1) a difference amplifier that can tolerate a 60V common mode voltage and (2) a gain reduction of 5 or more to bring the signal within the 5V range of a monolithic low voltage A/D converter.
3. By using an FPGA for the counter circuitry, many thousands of digital gates are available with great economy, thus the resolution of the counter has no practical limit. The only limitation lies in the analog portion, which is the offset voltage of U1, U2, etc.
4. Since the resolution is very high, it is possible to eliminate the analog Difference Amplifier Block in FIG. 1 as well as the internal $\Sigma$ block internal to the A/D converter, thus reducing cost/complexity as well as eliminating two potential noise/drift sources (consider any analog block to be a potential noise/drift contributor). This also is an expensive portion of the design, due to the accuracy/drift/noise requirements on these stages.
5. A supplemental advantage exists in that with the difference being taken in the digital section, it is also possible to read the absolute detector response without the reference. This is very desirable for very low cost applications as well as for diagnostic purposes.
6. While commercially available monolithic devices are targeted to deliver absolute voltage accuracy, the Gas Chromatograph (GC) detector 400 takes advantage of the fact that absolute accuracy is not a significant requirement for a GC detector. Thus, it is best to step away from the monolithic approach in order to gain the resolution required, such that both larger dynamic range and finite signal resolution are both attained without compromising noise and drift.
7. The phenomena of "idle tones" are a well-known and problematic artifact of $\Sigma$-$\Delta$ A/D converters, in cases where the DC signal is very close to mid-scale or zero (and such is the case for GC applications). With intuitive knowledge of the Gaussian GC peak shape, the Gas Chromatograph (GC) detector 400 presented can be tailored by design with the FPGA to anticipate the idle tone phenomena and eliminate the resulting artifacts from the GC baseline.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

Although the steps, operations, or computations may be presented in a specific order, this order may be changed in different embodiments. In some embodiments, to the extent multiple steps are shown as sequential in this specification, some combination of such steps in alternative embodiments may be performed at the same time.

Embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A Gas Chromatograph (GC) detector, comprising:
a first circuit including a first counter circuitry having a first N-bit counter to receive a first count up signal and a first count down signal in response to a first amplifier output and provide a first counter output;
a second circuit including a second counter circuitry having a second N-bit counter to receive a second count up signal and a second count down signal in response to a second amplifier output and provide a second counter output;
a digital subtractor to subtract the first counter output from the second counter output and provide a digital subtractor output; and
a digital logic shared between one to many detector channels to implement at least a portion of the first counter circuitry and the second counter circuitry, the digital logic to receive the digital subtractor output and provide a GC measurement in a digital form, wherein the digital logic is a Field Programmable Gate Array (FPGA) and the first circuit further comprising:
a reference amplifier including a first Thermal Conductivity Detector (TCD) to provide the first amplifier output.

2. The Gas Chromatograph (GC) detector of claim 1, wherein the reference amplifier further comprising:
a first resistive bridge, wherein the first N-bit counter controls a first pulse width modulated signal back to the first resistive bridge.

3. The Gas Chromatograph (GC) detector of claim 2, wherein the reference amplifier reacts with a positive or negative assertion to indicate the first N-bit counter to count up or down and when the first resistive bridge is balanced, the first N-bit counter is instructed neither to go up nor go down, and a first count is a stable value proportional to a first bridge voltage.

4. The Gas Chromatograph (GC) detector of claim 3, wherein the first circuit further comprising:
a first digital pulse width modulator (PWM), wherein the first count drives the first digital pulse width modulator (PWM) by making a first PWM output proportional to the first count.

5. The Gas Chromatograph (GC) detector of claim 4, wherein the first circuit further comprising:
a first switch coupled between an input voltage source and the first resistive bridge to receive the first PWM output on a gate of the first switch.

6. The Gas Chromatograph (GC) detector of claim 2, wherein the second circuit further comprising:
an amplifier including a second Thermal Conductivity Detector (TCD) to provide the second amplifier output.

7. The Gas Chromatograph (GC) detector of claim 6, wherein the amplifier further comprising:
a second resistive bridge, wherein the second N-bit counter controls a second pulse width modulated signal back to the second resistive bridge.

8. The Gas Chromatograph (GC) detector of claim 7, wherein the amplifier reacts with a positive or negative assertion to indicate the second N-bit counter to count up or down and when the second resistive bridge is balanced, the second N-bit counter is instructed neither to go up nor go down, and a second count is a stable value proportional to a second bridge voltage.

9. The Gas Chromatograph (GC) detector of claim 8, wherein the second circuit further comprising:
a second digital pulse width modulator (PWM), wherein the second count drives the second digital pulse width modulator (PWM) by making a second PWM output proportional to the second count.

10. The Gas Chromatograph (GC) detector of claim 9, wherein the second circuit further comprising:
a second switch coupled between an input voltage source and the second resistive bridge to receive the second PWM output on a gate of the second switch.

11. The Gas Chromatograph (GC) detector of claim 6, wherein the first Thermal Conductivity Detector (TCD) and the second Thermal Conductivity Detector (TCD) are a silicon MEMS TCD device.

12. The Gas Chromatograph (GC) detector of claim 1, wherein the GC detector not having an analog difference amplifier that removes a large common mode range and provides a highly resolved difference signal to a sigma-delta A/D converter and not having an internal sigma block internal to the sigma-delta A/D converter.

13. A Gas Chromatograph (GC) detector, comprising:
a first circuit portion including:
a constant temperature Thermal Conductivity Detector (TCD) reference amplifier including a first Thermal Conductivity Detector (TCD) and a first bridge, the constant temperature Thermal Conductivity Detector (TCD) reference amplifier to provide a first amplifier output,
a first comparator logic to receive the first amplifier output and provide a first count up signal and a first count down signal,
a first N-bit counter to receive the first count up signal and the first count down signal and provide a first counter output, and
a first N-bit Pulse Width Modulator (PWM) to provide a first PWM output;
a second circuit portion including:
a constant temperature Thermal Conductivity Detector (TCD) amplifier including a second Thermal Conductivity Detector (TCD) and a second bridge, the constant temperature Thermal Conductivity Detector (TCD) amplifier to provide a second amplifier output,
a second comparator logic to receive the second amplifier output and provide a second count up signal and a second count down signal,
a second N-bit counter to receive the second count up signal and the second count down signal and provide a second counter output, and
a second N-bit Pulse Width Modulator (PWM) to provide a second PWM output;
a digital subtractor of an A/D converter to subtract the first counter output from the second counter output and provide a digital subtractor output; and
a Field Programmable Gate Array (FPGA) shared between one to many detector channels, the FPGA to receive the digital subtractor output and provide a GC measurement in a digital form.

14. The Gas Chromatograph (GC) detector of claim 13, wherein the first circuit portion further comprising:
a first transistor coupled between an input voltage source and the first bridge to receive the first PWM output on a gate of the first transistor.

15. The Gas Chromatograph (GC) detector of claim 14, wherein the second circuit portion further comprising:
a second transistor coupled between the input voltage source and the second bridge to receive the second PWM output on a gate of the second transistor.

16. The Gas Chromatograph (GC) detector of claim 13, wherein the first Thermal Conductivity Detector (TCD) and the second Thermal Conductivity Detector (TCD) are a silicon MEMS TCD device.

17. The Gas Chromatograph (GC) detector of claim 13, wherein the A/D converter is a sigma-delta A/D converter, wherein the GC detector not having an analog difference amplifier that removes a large common mode range and provides a highly resolved difference signal to the sigma-delta A/D converter and not having an internal sigma block internal to the sigma-delta A/D converter.

* * * * *